(12) United States Patent
Dubois et al.

(10) Patent No.: US 7,670,966 B2
(45) Date of Patent: Mar. 2, 2010

(54) METHOD OF PROCESSING A SEMICONDUCTOR SUBSTRATE BY THERMAL ACTIVATION OF LIGHT ELEMENTS

(75) Inventors: Sébastien Dubois, Grenoble (FR); Nicolas Enjalbert, Les Avenirs (FR); Rémi Monna, Fontaine (FR)

(73) Assignee: Commissariat a l'Energie Atomique, Paris (FR)

( * ) Notice: Subject to any disclaimer, the term of this patent is extended or adjusted under 35 U.S.C. 154(b) by 0 days.

(21) Appl. No.: 12/401,152

(22) Filed: Mar. 10, 2009

(65) Prior Publication Data

US 2009/0253225 A1    Oct. 8, 2009

(30) Foreign Application Priority Data

Apr. 3, 2008    (FR) .................................. 08 52217

(51) Int. Cl.
    *H01L 21/00*    (2006.01)
(52) U.S. Cl. .................. 438/796; 438/58; 438/473; 257/E21.324
(58) Field of Classification Search ................. 438/796, 438/799, 795, 58, 473, 474, 471
    See application file for complete search history.

(56) References Cited

U.S. PATENT DOCUMENTS

| 4,320,247 | A | 3/1982 | Gatos et al. |
| 7,135,351 | B2 | 11/2006 | Binns et al. |
| 7,226,571 | B2 | 6/2007 | Takase et al. |

(Continued)

FOREIGN PATENT DOCUMENTS

DE    198 10 019 A1    10/1998

(Continued)

OTHER PUBLICATIONS

A. V. Mudryi, et al., "Impurities and defects in multicrystalline silicon for solar cells: low-temperature photoluminescence investigations", Solar Energy Materials & Solar Cells, vol. 72, No. 1-4, XP-004339798, Apr. 1, 2002, pp. 503-508.

(Continued)

*Primary Examiner*—Walter L Lindsay, Jr.
*Assistant Examiner*—Reema Patel
(74) *Attorney, Agent, or Firm*—Oblon, Spivak, McClelland, Maier & Neustadt, L.L.P.

(57) ABSTRACT

Method of processing a substrate containing at least one semiconductor of the $Si_XA_Y$ type and comprising at least four separate types of light elements, comprising at least the following steps:
- carrying out a first anneal of the substrate at a temperature T1 corresponding to a thermal activation temperature for a first one of the four types of light elements,
- carrying out a second anneal of the substrate at a temperature T2 corresponding to a thermal activation temperature for a second one of the four types of light elements,
- carrying out a third anneal of the substrate at a temperature T3 corresponding to a thermal activation temperature for a third one of the four types of light elements,
- carrying out a fourth anneal of the substrate at a temperature T4 corresponding to a thermal activation temperature for a fourth one of the four types of light elements,
- each anneal comprising a holding at the temperature T1, T2, T3 or T4 and the temperatures T1, T2, T3 and T4 being such that T1>T2>T3>T4.

16 Claims, 4 Drawing Sheets

U.S. PATENT DOCUMENTS

| | | | |
|---|---|---|---|
| 7,268,060 | B2 | 9/2007 | Ghyselen et al. |
| 2002/0121242 | A1 | 9/2002 | Minami et al. |
| 2003/0054641 | A1 | 3/2003 | Binns et al. |
| 2004/0005777 | A1* | 1/2004 | Qu et al. ............... 438/689 |
| 2007/0001241 | A1* | 1/2007 | Lim et al. ............... 257/410 |

FOREIGN PATENT DOCUMENTS

| | | |
|---|---|---|
| FR | 2 762 620 A1 | 10/1998 |
| FR | 2 906 403 | 3/2008 |

OTHER PUBLICATIONS

Vijay Yelundur, et al., "Improved String Ribbon Silicon Solar Cell Performance by Rapid Thermal Firing of Screen-Printed Contacts", IEEE Transactions on Electron Devices, vol. 49, No. 8, XP-011072335, Aug. 1, 2002, pp. 1405-1410.

Y. Poissant, et al., "Effects of Temperature on the Kinetics of Metastable Defect Creation in Polymorphous and Amorphous Silicon Materials and Solar Cells", 16$^{th}$ European Photovoltaic Solar Energy Conference, Conf. 16, XP-001138318, May 1-5, 2000, pp. 377-380.

D. Barakel, et al., "n-p Junction formation in P-type silicon by hydrogen ion implantation", Solar Energy Materials & Solar Cells, vol. 72, No. 1-4, XP-004339776, Apr. 1, 2002, pp. 285-290.

J. M. Ruiz, et al., "Electrical Parameter Changes in Silicon Solar Cells Induced by Thermal Donor Formation", Proceedings of the 21$^{st}$ IEEE Photovoltaic Specialists Conference, Kissimmee, FL, vol. 1, May 21-25, 1990, pp. 284-288.

Akito Hara, et al., "New carbon related defects formed in nitrogen rich Czochralski silicon crystals", App. Phys. Lett., 59 (15), Oct. 7, 1991, pp. 1890-1892.

Kh. A. Abdullin, et al., "Shallow hydrogen-induced donor in monocrystalline silicon and quantum wires", Materials Science in Semiconductor Processing, vol. 7, 2004, pp. 447-451.

D. J. Chadi, "Halogen impurities in silicon: Shallow single donors", Appl. Phys. Lett., vol. 71, No. 6, Jun. 9, 1997, pp. 806-808.

S. Dubois, et al., "Effect of intentional bulk contamination with iron on multicrystalline silicon solar cell properties", Journal of Applied Physics, 102, 2007, pp. 083525-1 to 083525-7.

L. Tsetseris, et al., "Thermal donor formation processes in silicon and the catalytic role of hydrogen", Applied Physics Letters, 88, 2006, pp. 051916-1 to 051916-3.

E. Simoen, et al., "Hydrogen plasma-enhanced thermal donor formation in n-type oxygen-doped high-resistivity float-zone silicon", Applied Physics Letters, vol. 81, No. 10, Sep. 2, 2002, pp. 1842-1844.

Karsten Bothe, et al., "Effective Reduction of the Metastable Defect Concentration in Boron-Doped Czochralski Silicon for Solar Cells", Inst. for Solarenergieforschung Hameln/Emmerthal (ISFH), Emmerthal, Germany, Photovoltaic Specialist Conference, 2002. Conference Record of the Twenty-Ninth IEEE, May 19-24, 2002, pp. 194-197.

G. I. Voronkova, et al., "Effect of Annealing on the Electrical Properties of Nitrogen-Doped Float-Zoned Silicon", ECS Transactions, 3, (4), 2006, pp. 225-235.

B. Holm, et al., "Formation of shallow donor in fluorine-implanted silicon", J. Appl. Phys., 79, (3), Feb. 1, 1996, pp. 1807-1809.

H. E. Wagner, et al., "N-O related shallow donor in silicon: Stoichiometry investigations", Applied Physics Letters, 91, 2007, pp. 152102-1 to 152102-3.

Kazumi Wada, "Unified model for formation kinetics of oxygen thermal donors in silicon", The American Physical Society, Physical Review B, vol. 30, No. 10, Nov. 15, 1984, pp. 5884-5895.

* cited by examiner

METHOD OF PROCESSING A SEMICONDUCTOR SUBSTRATE BY THERMAL ACTIVATION OF LIGHT ELEMENTS

TECHNICAL FIELD

This invention relates to a method of processing a semiconductor-based substrate by thermal activation of light elements present in the substrate. The invention likewise relates to a method of producing a semiconductor device from a substrate comprising thermally activated light elements. The invention is particularly applicable to the production of photovoltaic cells.

PRIOR ART

A considerable amount of research relates to the production of crystalline silicon (monocrystalline or polycrystalline) for the production of substrates, in particular within the field of photovoltaic applications, from silicon that has been purified by metallurgical methods or by chemical degradation. The silicon obtained from these new sources generally contains concentrations of metallic impurities (e.g., iron, chromium, copper, etc.), doping impurities (e.g., boron, phosphorous, aluminium, etc.), and light elements (e.g., oxygen, nitrogen, carbon, hydrogen, etc.) which are much higher than in electronic-grade silicon.

The metallic impurities present in this type of silicon are generally eliminated in large part during the directional solidification of the silicon ingot via segregation and, when this silicon is used to produce photovoltaic cell substrates, during the cell manufacturing process, which enables the residual metallic impurities to be extracted via the getter effect or by means of passivation via the hydrogen used. The document "Electrical parameter changes in silicon solar cells induced by thermal donor formation" by J. M. Ruiz et al, Proceedings of the 21st IEEE Photovoltaic Specialists Conference, Kissimmee, Fla., from May 21-25, 1990, Conference Record, Vol. 1, 1990, pages 284 to 288, describes the trapping of metallic impurities by the getter effect, owing to an annealing step at a temperature equal to approximately 450° C.

Although this extraction of metallic impurities partially purifies this type of silicon, the efficiency of a photovoltaic cell such as this remains lower than the efficiency of a photovoltaic cell made with an electronic-grade silicon substrate, because of the presence of high concentrations of doping impurities.

The doping impurities confer upon the semiconductor their type of conductivity, p or n. They have an influence on the transport properties of the free charges (electrons or holes) in the semiconductor. They also have a direct influence on the life time τ of the free charges as well as on the diffusion length L thereof. The energy conversion efficiency of photovoltaic cells manufactured from a semiconductor such as silicon that has been purified by metallurgical methods or by chemical degradation is therefore generally limited by this excessive quantity of doping impurities.

Furthermore, the significant presence of light elements, such as the oxygen present in particular in monocrystalline silicon fabricated by the Czochralski (Cz) growth method, or polycrystalline silicon fabricated from loads of silicon that has been purified by chemical degradation or by metallurgical methods, likewise results in a significant degradation in the efficiency of the photovoltaic cells produced from this silicon, in particular when they are under illumination.

DISCLOSURE OF THE INVENTION

Thus there is a need to propose a method of processing a semiconductor-based substrate which, in particular when the substrate is semiconductor-based and comprises several types of light elements, e.g., such as silicon that has been purified by metallurgical methods or by chemical degradation, enables improvement in the electrical quality of the semiconductor of the substrate.

One purpose of this invention is likewise to propose a method of producing a semiconductor device, and particularly a photovoltaic cell, the implementation of which enables the electrical quality of the semiconductor of the substrate used to be improved substantially, thereby improving the performance of the semiconductor device, e.g., the energy conversion efficiency of the device when it is a photovoltaic cell.

To accomplish this, one embodiment of the invention proposes a method of processing a substrate containing at least one semiconductor comprising at least four separate types of light elements, comprising at least the following steps:

carrying out a first anneal of the substrate at a temperature T1 corresponding to a thermal activation temperature for a first one of the four types of light elements, carrying out a second anneal of the substrate at a temperature T2 corresponding to a thermal activation temperature for a second one of the four types of light elements, carrying out a third anneal of the substrate at a temperature T3 corresponding to a thermal activation temperature for a third one of the four types of light elements, carrying out a fourth anneal of the substrate at a temperature T4 corresponding to a thermal activation temperature for a fourth one of the four types of light elements, the temperatures T1, T2, T3 and T4 being such that T1>T2>T3>T4.

Another embodiment of the invention relates to a method of processing a substrate containing at least one semiconductor of the $Si_xA_Y$ type, x being a strictly positive number, y being a positive number and A designating a chemical element or a compound of several chemical elements of the fourteenth column of the periodic table of elements, and comprising at least four separate types of light elements, the method comprising at least the following steps:

carrying out a first anneal of the substrate at a temperature T1, corresponding to a thermal activation temperature for a first one of the four types of light elements, carrying out, after the first anneal, a second anneal of the substrate at a temperature T2, corresponding to a thermal activation temperature for a second one of the four types of light elements, carrying out, after the second anneal, a third anneal of the substrate at a temperature T3, corresponding to a thermal activation temperature for a third one of the four types of light elements, carrying out, after the third anneal, a fourth anneal of the substrate at a temperature T4, corresponding to a thermal activation temperature for a fourth one of the four types of light elements, each anneal comprising a holding, or maintenance, at the temperature T1, T2, T3 or T4 for a predetermined time period, and the temperatures T1, T2, T3 and T4 being such that T1>T2>T3>T4.

A "light element" is understood to mean an element containing an atomic number Z lower than 18.

Furthermore, a "compound" is understood to mean a product consisting of the union of two or more chemical elements in specific weight proportions.

The substrate contains at least one semiconductor of the $Si_XA_Y$ type, i.e., containing silicon and possibly containing at least one other element of the family of crystallogens (elements of the fourteenth column of the periodic table of elements).

In this way, thermal activation of the light elements present in the semiconductor of the substrate activates the electron donor character of these elements, i.e., the capacity of same to release electrons into the semiconductor. The temperature at which each of the annealing operations is carried out corresponds to the temperature at which a type of light element present in the substrate is thermally activated.

Furthermore, given that thermal activation of a type of light element can be "cancelled" by next carrying out another anneal at a higher temperature than the preceding anneal carrying out said activation, then, by carrying out several anneals ranging from the highest thermal activation temperature to the lowest thermal activation temperature, this method enables the various types of light elements present in the semiconductor to be activated successively, without cancelling the previous thermal activations carried out during the process.

For example, the main light element present in the monocrystalline silicon fabricated by the Cz growth method is oxygen, because it is initially present in the silica crucible used to grow the silicon ingots. An anneal at around 450° C. enables this element to be thermally activated. An anneal such as this at approximately 450° C. enables the diffusion of oxygen dimmers which combine to form a species at the most complex stoichiometry, which behaves as an electron donor in the silicon. The donor thus formed is stable at ambient temperature, however an anneal at a temperature close to or greater than approximately 700° C. enables the dissociation thereof, which would cancel the effects of the previously carried out thermal activation.

Furthermore, the degradation under illumination of the conversion efficiency of the photovoltaic cells produced from a substrate subjected to this processing method is attenuated, in particular when one of the activated thermal donors is oxygen. Furthermore, this processing method enables a getter effect to be produced in the substrate, which promotes elimination of the metallic impurities present in the substrate.

The annealing operations require that the temperature be maintained, or held, for a certain time period. Thermal activation has a long kinetics: thus, the stages (at temperatures T1, T2, T3 or T4) are maintained for a period greater than or equal to approximately 10 minutes, or greater than or equal to approximately 30 minutes, this period likewise being capable of being extended for several hours.

The semiconductor may be of crystalline silicon of the p type.

Each of the four types of light elements present in the semiconductor may be either oxygen, nitrogen, carbon, hydrogen, fluoride, sulphur, chloride, a compound of nitrogen and oxygen, or other compounds of these various elements.

T1 may be between approximately 530° C. and approximately 830° C., and/or T2 may be between approximately 450° C. and 750° C., and/or T3 may be between approximately 350° C. and 650° C., and/or T4 may be between approximately 300° C. and 600° C.

T1 may be equal to approximately 680° C., and/or T2 may be equal to approximately 600° C., and/or T3 may be equal to approximately 500° C., and/or T4 may be equal to approximately 450° C.

After completion of the fourth anneal, the processing method may further comprise carrying out a fifth anneal at a temperature T5, corresponding to a thermal activation temperature for a fifth type of light elements present in the semiconductor, which is separate from the other four types of light elements present in the semiconductor, with T5<T4.

After completion of the fifth anneal, the processing method may further comprise carrying out a sixth anneal at a temperature T6, corresponding to a thermal activation temperature for a sixth type of light elements present in the semiconductor, which is separate from the other five types of light elements present in the semiconductor, with T6<T5.

After completion of the sixth anneal, the processing method may further comprise carrying out a seventh anneal at a temperature T7, corresponding to a thermal activation temperature for a seventh type of light elements present in the semiconductor, which is separate from the other six types of light elements present in the semiconductor, with T7<T6.

After completion of the seventh anneal, the processing method may further comprise carrying out an eighth anneal at a temperature T8, corresponding to a thermal activation temperature for an eighth type of light elements present in the semiconductor, which is separate from the other seven types of light elements present in the semiconductor, with T8<T7.

At least one of the annealing operations may be carried out in a lamp oven in which the semiconductor-based substrate is arranged.

Furthermore, at least one of the annealing operations may be carried out under an oxygen and/or nitrogen and/or hydrogen and/or argon and/or helium atmosphere.

The annealing operations may be carried out on an ingot of the semiconductor, the substrate next being obtainable by cutting out a wafer from the ingot. In this way, it is possible to reduce the thermal budget used during this cutting-out step.

The processing method may produce the thermal activation of the chloride elements present in the substrate via an anneal at a temperature of between approximately 350° C. and 1000° C.

The processing method may produce the thermal activation of the carbon elements, of which the donors combining elements C, N and O are formed during annealing operations at between approximately 500° C. and 700° C.

The processing method may produce the thermal activation of the sulphur elements present in the substrate via an anneal at a temperature of between approximately 482° C. and 594° C.

Finally, it is possible to produce a particular effective activation of the donor character of the fluoride present in the substrate via an anneal at a temperature equal to approximately 600° C.

Another embodiment of the invention likewise relates to a method of producing a semiconductor device from a substrate containing at least one semiconductor, e.g., of the $Si_XA_Y$ type, x being a strictly positive number, y being a positive number and A designating a chemical element or a compound of several chemical elements of the fourteenth column of the periodic table of elements, and comprising at least the implementation of the substrate processing method according to the invention, as previously described.

In this case, the semiconductor device may comprise at least one photovoltaic cell. As a matter of fact, this processing method applies particularly well to the silicon used by the photovoltaic industry, because Cz monocrystalline silicon and polycrystalline silicon, whether purified or not by metallurgical methods, contain high concentrations of light elements, and of oxygen in particular. The processing method makes it possible to neutralize the recombinant power of the doping species present in this silicon, thereby improving the performance of the p-type crystalline silicon photovoltaic cells produced from substrates thus processed.

When the substrate contains p-type crystalline silicon, the method of producing the semiconductor device may further comprise the following steps:

- texturing at least a first face of the substrate intended to form a front face of the photovoltaic cell,
- formation of an N+ doped layer at the faces of the substrate,
- deposition of a passivation and/or anti-reflective layer on the N+ doped layer, at the level of the first face of the substrate,
- producing conductive contacts on the passivation and/or anti-reflective layer and on the N+ doped layer, at the level of the second face, opposite the first face of the substrate,
- annealing the conductive contacts,
- etching the N+ doped layer at the level of the faces of the substrate which are substantially perpendicular to the first and second faces of the substrate, the steps of the substrate processing method may be implemented prior to the texturing step, and/or after the etching step, and/or between two steps of the method of producing the semiconductor device.

Thus, during the course of a method of producing a p-type homojunction photovoltaic cell, the activation anneals of the thermal donors may be carried out between two steps of the method of producing the cell. The annealing operations may more particularly be carried out after the step of forming the N+ doped layer, implemented, for example, by diffusing phosphorous into the substrate, or after the deposition of the passivation and/or anti-reflective layer, or after the annealing of the conductive contacts. Furthermore, given that the deposition of the passivation and/or anti-reflective layer, e.g., containing SiN, enables hydrogen to be introduced at the surface and within the volume of the substrate, and that the hydrogen is a thermal donor-forming catalyst, it is particularly advantageous to implement the thermal activation annealing operations after depositing the passivation layer or after annealing the conductive contacts.

In one alternative, when the substrate contains a p-type crystalline silicon, the method of producing the semiconductor device may further comprise at least one step of depositing a layer of amorphous silicon onto two opposite faces of the substrate intended to form the front and rear faces of the photovoltaic cell, the steps of the substrate processing method may be implemented prior to this deposition step.

During the course of a method of producing a photovoltaic cell with amorphous silicon-crystalline silicon heterojunctions, the steps of the method of producing the cell may be carried out at low temperature, i.e., at a temperature of less than approximately 400° C. Thus, the thermal activation annealing operations of the donors may be implemented prior to the heterojunction formation step, or on the silicon ingot or on the substrate obtained after cutting out the ingot, prior to the start of the method of producing the photovoltaic cell.

The invention may likewise find applications in fields other than that of photovoltaic cells, e.g., in the production of optoelectronic devices from semiconductor substrates comprising significant concentrations of light elements.

BRIEF DESCRIPTION OF THE DRAWINGS

This invention will be better understood upon reading the description of exemplary embodiments given for purely illustrative and non-limiting purposes, with reference to the appended drawings, in which.

Identical, similar or equivalent portions of the figures described below bear the same numeric references so as to facilitate moving from one figure to another.

The various portions shown in the figures are not necessarily shown according to one uniform scale, in order to render the figures more legible.

The various possibilities (alternatives and embodiments) should be understood as not being mutually exclusive and can be combined with one another.

DETAILED DISCLOSURE OF PARTICULAR EMBODIMENTS

Reference is made first to FIGS. 1A to 1F, which show the steps of a method of producing a photovoltaic cell 100 according to a first exemplary embodiment.

Figure 1A:
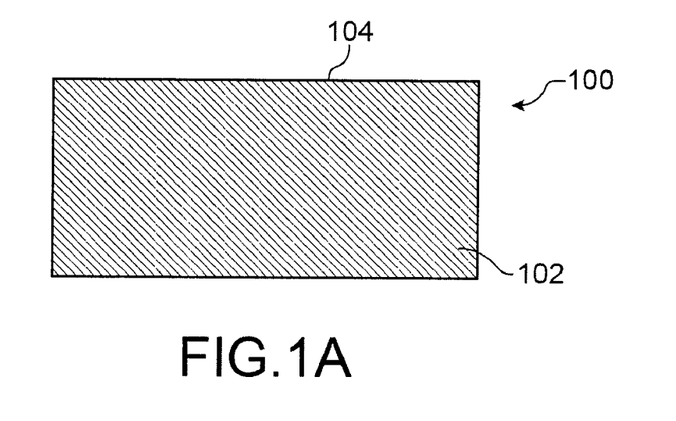
FIGS. 1A to 1F show steps of a method of producing a homojunction photovoltaic cell according to one particular exemplary embodiment.

As shown in FIG. 1A, the photovoltaic cell 100 is produced from a semiconductor-based substrate 102, e.g., p-type crystalline silicon. This silicon, e.g., monocrystalline and obtained by Cz growth, comprises significant concentrations of doping impurities, and born in particular. These concentrations, for example, may be between approximately $10^{15}$ cm$^{-3}$ and $3.10^{18}$ cm$^{-3}$. Furthermore, given that this silicon was obtained by Cz growth, it likewise comprises a significant quantity of light elements, particularly oxygen, which, for example, may be between approximately $10^{17}$ cm$^{-3}$ and $5.10^{18}$ cm$^{-3}$.

To produce the photovoltaic cell 100, a texturing of the face 104 of the substrate 102 is first carried out, this face 104 being intended to form the front face of the photovoltaic cell 100, i.e., the face intended to receive the light. This texturing may be obtained chemically, e.g., with a solution of KOH applied to the face 104. The texturing of the face 104 makes it possible to reduce the reflectivity of this face 104, but to likewise produce an optical confinement in the substrate 102 of the light rays entering through this face 104.

Figure 1B:
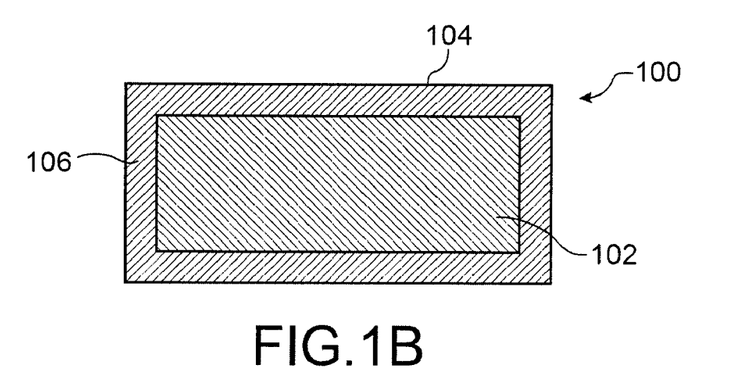

An N+ doped layer 106 is next formed, e.g., via a diffusion of phosphorous around the P-doped substrate 102. A PN junction is thus formed between this layer 106 and the rest of the substrate 102.

Figure 1C:
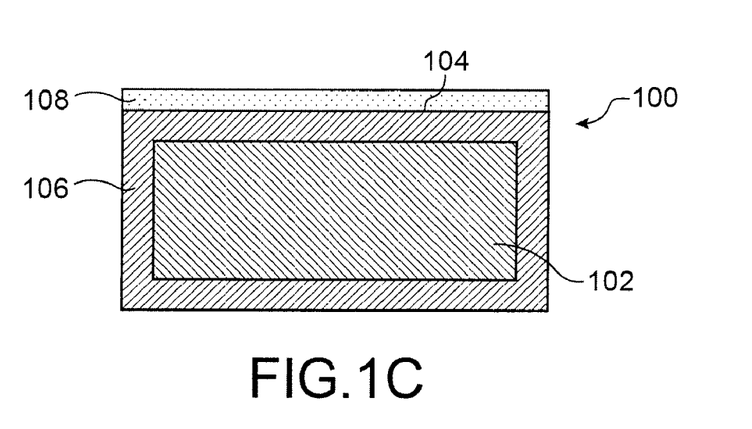

As shown in FIG. 1C, by means of PECVD deposition (plasma-enhanced chemical vapour deposition), a SiN—H-based layer 108, i.e., hydrogen-rich silicon nitride, is then produced on face 104. This layer 108 thus forms an anti-reflective layer for the photovoltaic cell 100. This layer 108 likewise enables the electrical passivation of face 104 to be carried out.

Figure 1D:
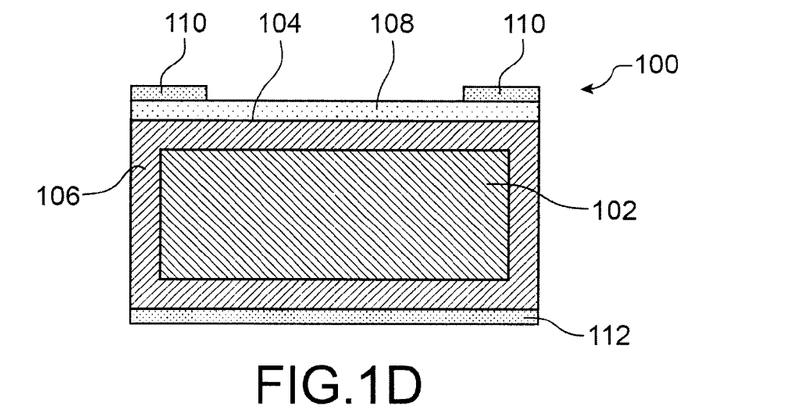

Next, contacts 110 are then produced on the front face of the photovoltaic cell 100. These conductive contacts 110 may be obtained by depositing a metallic layer, e.g., containing silver, onto layer 108, and by then screen printing this silver layer. A rear conductive contact 112, which is formed here by a metallic layer, e.g., containing aluminium, is likewise produced on the rear face of the photovoltaic cell 100 (FIG. 1D).

Figure 1E:
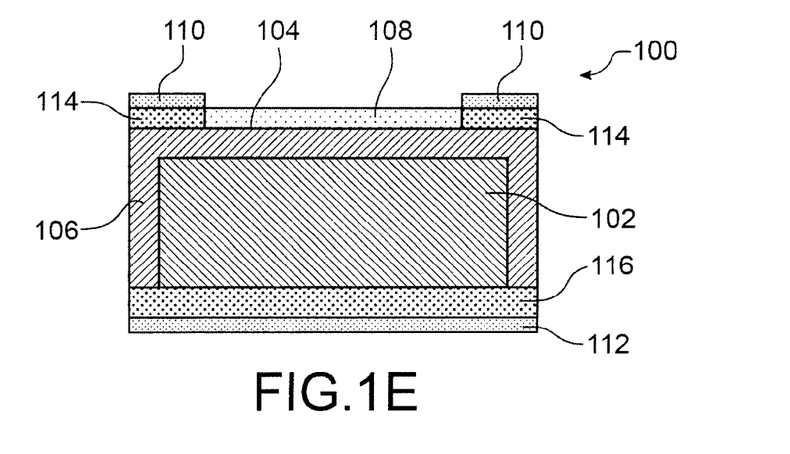

An anneal of the contacts 110 and 112, e.g., at a temperature of between approximately 700° C. and 900° C., for a period of between approximately 1 second and 10 minutes, and, in this case, in an infrared lamp oven, enables the front 110 and rear 112 contacts to cure with the silicon. This contact curing corresponds to the formation of conductive regions 114 containing silver and silicon, between the front contacts 110 and the N+ doped layer 106, and of a conductive region 116 containing aluminium and silicon, between the rear contact 112 and the substrate 102 serving as a back surface field (BSF) and enabling the trapping of impurities owing to the getter segregation effect produced by the aluminium and silicon alloy presents in the rear face. Furthermore, given that layer 108 is SiN—H-based, this anneal likewise produces a diffusion of hydrogen atoms from layer 108 into the substrate 102, thereby making it possible to passivate the metallic impurities located in the substrate 102 (FIG. 1E).

Figure 1F:
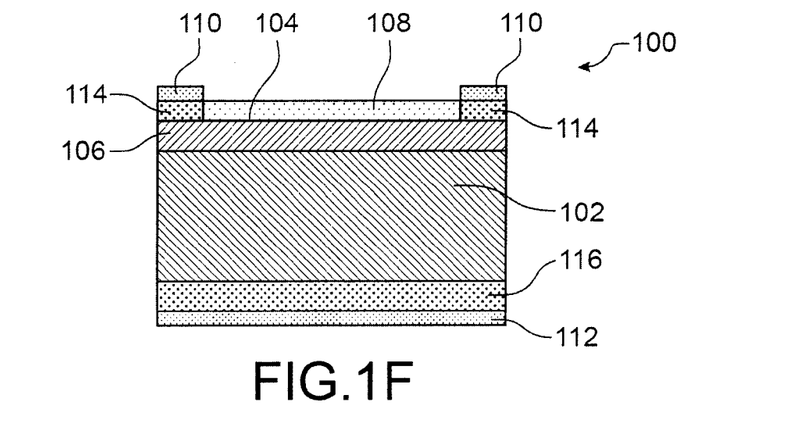

Finally, as shown in FIG. 1F, an opening is made in the PN junction formed by the substrate 102 and the N+ doped layer 106, by etching, in particular, the portions of layer 106 not situated at the level of the front face of the photovoltaic cell 100. This opening may be made by laser etching, plasma etching, coating, or any other means of etching.

Over the course of this method of producing the photovoltaic cell 100, e.g., between two steps of this method, a method of processing the substrate 102 is implemented, in order to thermally activate the light elements present in the substrate 102. In the example described here, four types of light elements are present in the substrate 102: nitrogen, compounds consisting of nitrogen and oxygen, hydrogen and oxygen.

A first anneal is carried out first at a temperature T1, in order to thermally activate the light elements the activation temperature of which is the highest. In the example described here, it is the nitrogen which has the highest activation temperature, this being between approximately 530° C. and 830° C. This first anneal, for example, is carried out at a temperature T1 equal to approximately 680° C.

A second anneal is then carried out at a temperature T2, in order to thermally activate the light elements the activation temperature of which is the second highest, such that T2<T1. It is a matter here of compounds of nitrogen and oxygen which may be thermally activated at a temperature of between approximately 450° C. and 750° C. This second anneal, for example, is carried out at a temperature T2 equal to approximately 600° C.

A third anneal is then carried out at a temperature T3, in order to thermally activate the light elements the activation temperature of which is the third highest, such that T3<T2. It is a matter here of the hydrogen, which may be thermally activated at a temperature of between approximately 350° C. and 650° C. This third anneal, for example, is thus carried out at a temperature T3 equal to approximately 500° C.

A fourth anneal is then carried out at a temperature T4, in order to thermally activate the light elements the activation temperature of which is the lowest. It is a matter here of the oxygen, which may be thermally activated at a temperature of between approximately 300° C. and 600° C. This fourth anneal, for example, is thus carried out at a temperature T4 equal to approximately 450° C.

The method for thermally activating the light elements present in the substrate therefore consists here of a succession of annealing operations the temperatures of which decrease each time in relation to the preceding anneal. Therefore, in this case, T1>T2>T3>T4. Furthermore, the duration of each anneal is adapted on the basis of the concentration of the light elements in the substrate. The higher this concentration is, the longer the anneal time, i.e., the holding time at temperatures T1, T2, T3 or T4, in order thermally activate the light elements as much as possible. Each anneal, for example, may be carried out over a period of between a few minutes and a few hours, this period, for example, being greater than or equal to approximately 10 or 30 minutes. The time periods during which the substrate is held at the annealing temperatures are chosen on the basis of the initial concentrations of light elements in the substrate which must be thermally activated, but also on the presence of other chemical elements which can form catalysts for the thermal activation reaction (e.g., such as the hydrogen elements during thermal activation of the oxygen elements). The interstitial oxygen concentrations, for example, may be measured by FTIR spectrometry (Fourier transform infrared spectrometry). The hydrogen concentrations may be measured by SIMS spectrometry (secondary ion mass spectrometry). The concentrations of C, N, O and S elements may further be measured by IGA analysis (under an inert gas).

The temperature examples provided here are provided as a guideline. In order to accelerate thermal activation, and therefore to reduce the anneal time, it is possible to carry out these annealing operations at higher temperatures. The temperatures at which the annealing operations are carried out should, however, remain within a certain range, so as to thermally activate the elements and not exceed certain thresholds, at the risk of deactivating the donor character of the elements. In the example given here, the first thermal activation anneal of the nitrogen may be carried out at a temperature T1 equal to approximately 830° C., the second thermal activation anneal of the nitrogen and oxygen compounds at temperature T2 equal to approximately 750° C., the third thermal activation anneal of the hydrogen at a temperature T3 equal to approximately 650° C., and finally the fourth thermal activation anneal of the oxygen at a temperature T4 equal to approximately 600° C. Furthermore, when the oxygen is the majority species present in the substrate in comparison with the other light elements, the duration of the fourth anneal may be greater than the duration of the other annealing operations.

Given that the hydrogen acts as a catalyst for the thermal activation of the oxygen, the thermal activation annealing operations may be advantageously implemented after the step of depositing the layer 108 of SiN—H, and in particular after the step of annealing the contacts 110 and 112, taking into account the present of hydrogen in the substrate, which is diffused from layer 108 during annealing of the contacts 110 and 112, this hydrogen likewise being thermally activatable.

In one alternative, the thermal activation annealing operations may likewise be carried out prior to the step of texturing the face 104 of the substrate 102, i.e., carried out on the substrate 102 prior to any other steps related to the production of the photovoltaic cell 100. In another alternative, the annealing operations may be carried out on the semiconductor ingot used to produce the substrate 102, i.e., even before the substrate 102 has been produced by cutting out a wafer from the ingot.

Finally, in another alternative, the annealing operations may likewise be carried out once the photovoltaic cell 100 has been finished, e.g., after the step of opening the cell 100 junction.

The effect of thermally activating the donor character of the light elements on the lifetime τ of the charge carriers will now be described in greater detail.

The doping impurities present in the substrate, such as boron and phosphorous, introduce levels of energy into the forbidden band of the silicon, which are situated in the vicinity of the valence bands (for the boron) and conduction bands (for the phosphorous). These energy levels may enable recombining of the free charges, and therefore shorten the lifetime τ of the free charges and thus the diffusion length L thereof. Such being the case, the recombinant power of an energy level situated near the valence or conduction bands depends on the position of the Fermi level or on the resistivity. The recombinant power of an energy level decreases when the Fermi level approaches the middle of the forbidden band, and therefore when the resistivity increases.

Figure 2:
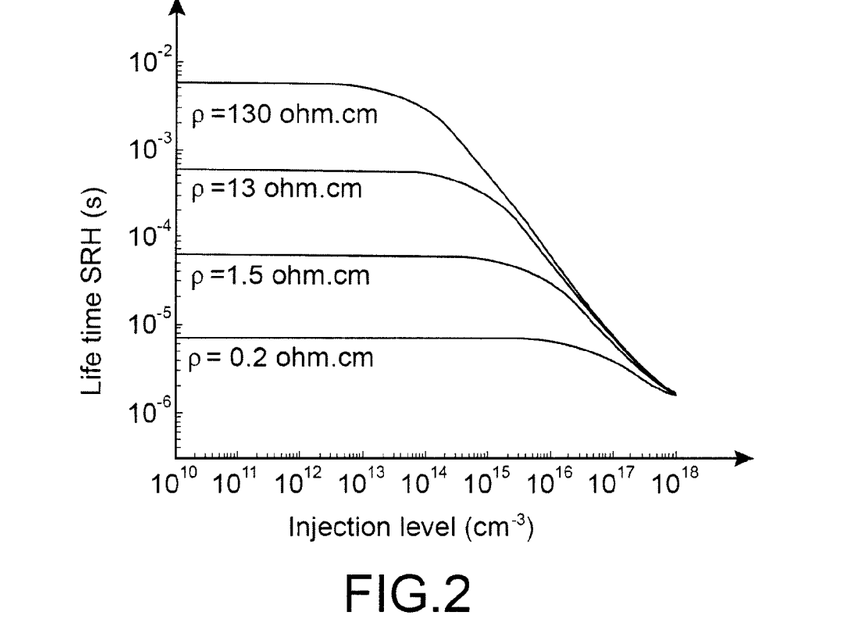
FIG. 2 shows the evolution of the lifetime of the free charges in relation to the injection level for various silicon resistivity values, and for an energy level situated at 0.1 eV of the conduction band.

FIG. 2 shows the effect of resistivity on the evolution of the lifetime of the free charges in relation to the injection level, calculated from the Schockley-Read-Hall statistics (SRH), for an energy level situated at 0.1 eV of the conduction band. The concentration of the recombination centre is $10^{13}$ cm$^{-3}$, and the electron and hole capture cross sections thereof are equal to approximately $10^{-14}$ cm$^2$.

Figure 3:
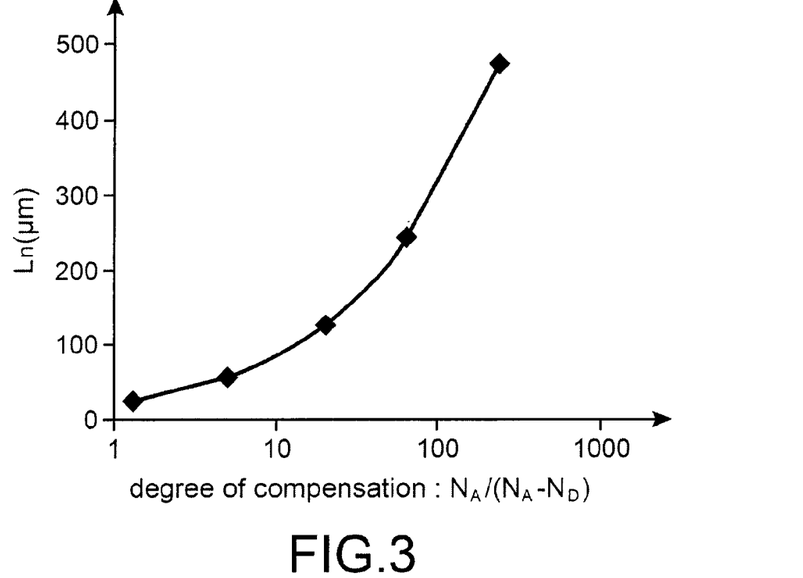
FIG. 3 shows the evolution of the diffusion length in relation to the degree of boron compensation in silicon for a given concentration of boron.

In this way, for a given boron concentration, the diffusion length increases when the boron present in the silicon is compensated for by another doping impurity having a donor character. FIG. 3, which shows a simulation result demonstrating that, for a given boron concentration (in this case $3.10^{17}$ cm$^{-3}$), the diffusion length increases when the degree of compensation of the boron increases (the degree of compensation being $N_A/(N_A-N_D)$, with $N_A$ being the concentration of acceptor centres, and $N_D$ the concentration of electron donor centres).

Thus, when boron is present in high concentration, it is sensible to increase the degree of compensation of the material, in order to increase the diffusion lengths and consequently the conversion efficiency of the cells. This is likewise true when the boron is replaced by another impurity which has an acceptor behaviour in silicon, e.g., aluminium, gallium, or else indium.

This degree of compensation may be increased by thermally activating the donor character of the light elements in the silicon.

Thermal activation of the donor elements is therefore confirmed by measuring the resistivity of the semiconductor material.

The activation annealing operations may be carried out in tube furnaces, an oven, passage kilns or via rapid annealing operations in lamp ovens. Illumination of the silicon wafers during annealing may also facilitate the formation of the thermal donors. This is the case in particular of thermal donors combining oxygen. As a matter of fact, the formation of these complexes involves the diffusion of oxygen dimmers. Such being the case, the diffusion of the latter is faster when the wafer is illuminated (diffusion via a Bourgoin-Corbett mechanism).

Figure 4:
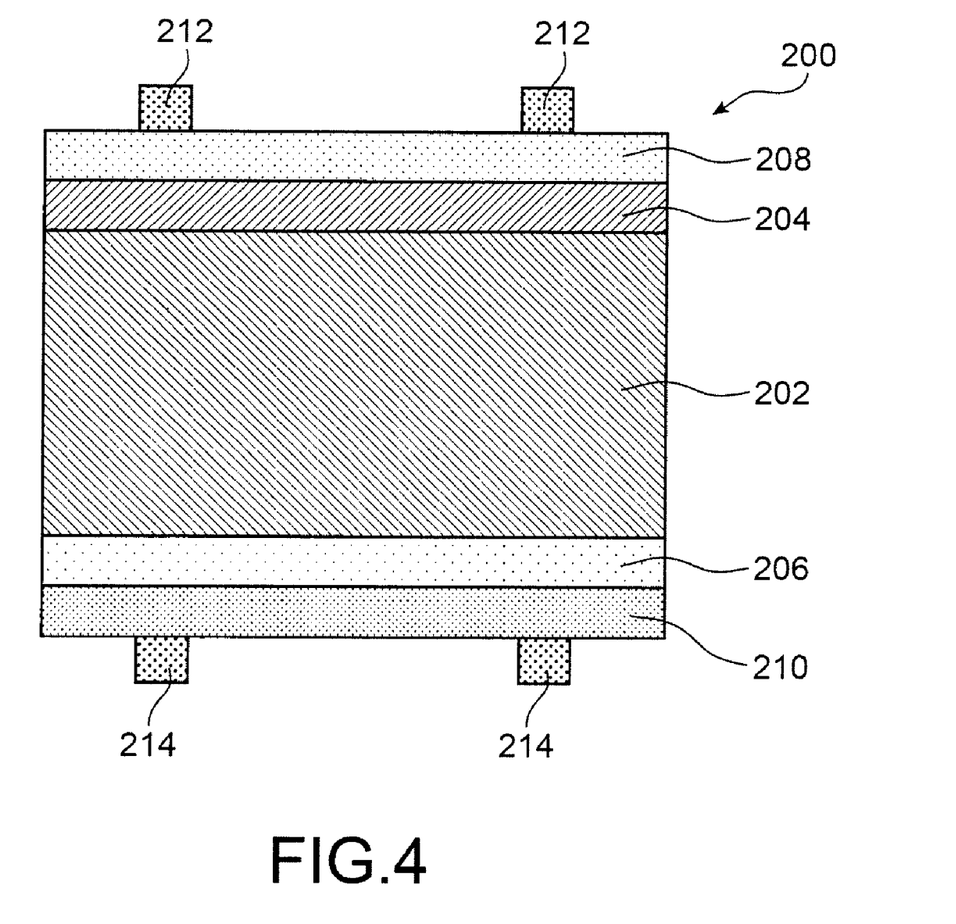
FIG. 4 shows a heterojunction photovoltaic cell produced from a substrate with thermally activated light elements.

A substrate with thermally activated light elements may likewise be used to produce a heterojunction photovoltaic cell, e.g., such as the cell 200 shown in FIG. 4.

This cell 200 is produced from a substrate 202, which, in this case, contains a crystalline semiconductor (monocrystalline or polycrystalline) such as a p-type silicon that has been purified by metallurgical methods or by chemical degradation, i.e., comprising significant concentrations of doping impurities and light elements.

In order to produce the photovoltaic cell 200, a texturing of the surfaces of the substrate 202 is first carried out, and then specific cleaning of these surfaces and a hydrofluoric acid treatment. A deposition, e.g., PECVD-type deposition, of amorphous silicon layers 204 and 206 is then carried out on the front face and on the rear face of the substrate 202, respectively. The amorphous silicon layers 204 and 206 are of the n-type and p-type, respectively. In this way, a PN junction is produced between the amorphous silicon layer 204 and the crystalline silicon substrate 202 and the amorphous silicon layer 206.

Transparent conductive oxide layers 208 and 210, e.g., containing ITO (indium-tin oxide), are next deposited on the amorphous silicon layers 204 and 206, respectively, e.g., via spraying, vacuum evaporation, LPCVD (low-pressure chemical vapour deposition), or else PECVD (plasma-enhanced chemical vapour deposition). Finally, metallic contacts 212 and 214 are produced at the level of the front face of the photovoltaic cell 200, i.e., on the transparent conductive oxide layer 208, and at the level of the rear face of the photovoltaic cell 200, i.e., on the transparent conductive oxide layer 210, respectively, e.g., by screen printing with a conductive paste and low-temperature annealing (e.g., equal to approximately 200° C.).

These steps of producing the heterojunction photovoltaic cell 200 are carried out at low temperatures (e.g., lower than approximately 400° C.). The substrate processing as described above, which enables thermal activation of the light elements present in the substrate 202, may bring into play temperatures greater than approximately 400° C., which processing may therefore be implemented at the start of the process, on the silicon ingot used to produce the substrate 202, or directly on the substrate 202, i.e., prior to the texturing step, or between the texturing step and the cleaning step, or between the cleaning step and the hydrofluoric acid treatment step, or between the hydrofluoric acid treatment step and the step of depositing the amorphous silicon layers 204, 206.

The implementation of the processing method is described hereinbelow with respect to a monocrystalline silicon-based substrate initially comprising a boron concentration equal to approximately $9.10^{16}$ cm$^{-3}$ and a phosphorous concentration equal to approximately $8.10^{16}$ cm$^{-3}$, i.e., in this case a p-type silicon the hole concentration of which is equal to approximately $1.10^{16}$ cm$^{-3}$. The initial concentration of oxygen is equal to approximately $10^{18}$ cm$^{-3}$ and the initial concentrations of hydrogen, fluoride and nitrogen are all three equal to approximately $10^{16}$ cm$^{-3}$.

A first anneal is carried out at a temperature equal to approximately 700° C., this temperature being held substantially constant over a time period equal to approximately 30 min. This first anneal makes it possible to create approximately $10^{15}$ cm$^{-3}$ of fluoride-based donor elements. A second anneal is carried out at a temperature equal to approximately 680° C., this temperature being held substantially constant over a time period equal to approximately 90 min. This second anneal makes it possible to create approximately $10^{15}$ cm$^{-3}$ of nitrogen-based donor electron elements. A third anneal is carried out at a temperature equal to approximately 450° C., this temperature being held substantially constant over a time period equal to approximately 5 hours. This third anneal makes it possible to create approximately $10^{15}$ cm$^{-3}$ of oxygen-based donor electron elements. Finally, a fourth anneal is carried out at a temperature equal to approximately 300° C., this temperature being held substantially constant over a time period equal to approximately 20 min. This fourth anneal makes it possible to create approximately $10^{15}$ cm$^{-3}$ of hydrogen-based donor electron elements.

These four annealing operations have thus made it possible to create a total concentration of electron donor elements in the substrate which is equal to approximately $4.10^{15}$ cm$^{-3}$. The hole concentration in the substrate at the completion of the four annealing operations is thus equal to approximately $6.10^{15}$ cm$^{-3}$.

The invention claimed is:

1. Method of processing a substrate containing at least one semiconductor of the $Si_XA_Y$ type, x being a strictly positive number, y being a positive number and A designating a chemical element or a compound of several chemical elements of the fourteenth column of the periodic table of elements, and comprising at least four separate types of light elements, the method comprising at least the following steps:

carrying out a first anneal of the substrate at a temperature T1, corresponding to a thermal activation temperature for a first one of the four types of light elements, carrying out, after the first anneal, a second anneal of the substrate at a temperature T2, corresponding to a thermal activation temperature for a second one of the four types of light elements, carrying out, after the second anneal, a third anneal of the substrate at a temperature T3, corresponding to a thermal activation temperature for a third one of the four types of light elements, carrying out, after the third anneal, a fourth anneal of the substrate at a temperature T4, corresponding to a thermal activation temperature for a fourth one of the four types of light elements, each anneal comprising a holding at the temperature T1, T2, T3 or T4 for a predetermined time period, and the temperatures T1, T2, T3 and T4 being such that T1>T2>T3>T4.

2. Method according to claim 1, wherein the semiconductor is a p-type crystalline silicon.

3. Method according to claim 1, wherein each of the four types of light elements present in the semiconductor is either oxygen, nitrogen, carbon, hydrogen, fluoride, sulphur, chloride, a compound of nitrogen and oxygen, or other compounds of these various elements.

4. Method according to claim 1, wherein T1 is between approximately 530° C. and approximately 830° C., and/or T2 is between approximately 450° C. and 750° C., and/or T3 is between approximately 350° C. and 650° C., and/or T4 is between approximately 300° C. and 600° C.

5. Method according to claim 1, wherein T1 is equal to approximately 680° C., and/or T2 is equal to approximately 600° C., and/or T3 is equal to approximately 500° C., and/or T4 is equal to approximately 450° C.

6. Method according to claim 1, further comprising, after carrying out the fourth anneal, carrying out a fifth anneal at a temperature T5, corresponding to a thermal activation temperature for a fifth type of light elements present in the semiconductor, which is separate from the other four types of light elements present in the semiconductor, with T5<T4.

7. Method according to claim 6, further comprising, after carrying out the fifth anneal, carrying out a sixth anneal at a temperature T6, corresponding to a thermal activation temperature for a sixth type of light elements present in the semiconductor, which is separate from the other five types of light elements present in the semiconductor, with T6<T5.

8. Method according to claim 7, further comprising, after carrying out the sixth anneal, carrying out a seventh anneal at a temperature T7, corresponding to a thermal activation temperature for a seventh type of light elements present in the semiconductor, which is separate from the other six types of light elements present in the semiconductor, with T7<T6.

9. Method according to claim 8, further comprising, after carrying out the seventh anneal, carrying out an eighth anneal at a temperature T8, corresponding to a thermal activation temperature for an eighth type of light elements present in the semiconductor, which is separate from the other seven types of light elements present in the semiconductor, with T8<T7.

10. Method according to claim 1, wherein at least one of the annealing operations is carried out in a lamp oven in which the semiconductor-based substrate is arranged.

11. Method according to claim 1, wherein at least one of the annealing operations is carried out under an oxygen and/or nitrogen and/or hydrogen and/or argon and/or helium atmosphere.

12. Method according to claim 1, wherein the annealing operations are carried out on an ingot of the semiconductor, the substrate next being obtainable by cutting out a wafer from the ingot.

13. Method of producing a semiconductor substrate device from a substrate containing at least one semiconductor of the $Si_X A_Y$ type, x being a strictly positive number, y being a positive number and A designating a chemical element or a compound of several chemical elements of the fourteenth column of the periodic table of elements, and comprising at least four separate types of light elements, comprising at least the implementation of the substrate processing method according to claim 1.

14. Method according to claim 13, wherein the semiconductor device comprises at least one photovoltaic cell.

15. Method according to claim 14, wherein the substrate contains p-type crystalline silicon, the method of producing the semiconductor device further comprising the following steps:

texturing at least a first face of the substrate intended to form a front face of the photovoltaic cell, formation of an N+ doped layer at the faces of the substrate, deposition of a passivation and/or anti-reflective layer on the N+ doped layer, at the level of the first face of the substrate, producing conductive contacts on the passivation and/or anti-reflective layer and on the N+ doped layer, at the level of the second face, opposite the first face of the substrate, annealing the conductive contacts, etching the N+ doped layer at the level of the faces of the substrate which hare substantially perpendicular to the first and second faces of the substrate, the steps of the substrate processing method being implemented prior to the texturing step, and/or after the etching step, and/or between two steps of the method of producing the semiconductor device.

16. Method according to claim 14, the substrate containing a p-type crystalline silicon, the method of producing the semiconductor device further comprising at least one step of depositing a layer of amorphous silicon onto two opposite faces of the substrate intended to form the front and rear faces of the photovoltaic cell, the steps of the substrate processing method being implemented prior to this deposition step.

* * * * *